(12) United States Patent
Purdy

(10) Patent No.: US 6,790,752 B1
(45) Date of Patent: Sep. 14, 2004

(54) METHODS OF CONTROLLING $V_{SS}$ IMPLANTS ON MEMORY DEVICES, AND SYSTEM FOR PERFORMING SAME

(75) Inventor: Matthew A. Purdy, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 10/358,587

(22) Filed: Feb. 5, 2003

(51) Int. Cl.[7] .............................................. H01L 21/425
(52) U.S. Cl. ...................... 438/524; 438/14; 438/289; 438/514; 438/424; 438/444; 438/449; 438/450
(58) Field of Search .................................. 438/424, 439, 438/444, 449, 450, 700, 14, 289, 514, 517, 524; 257/315, 330

(56) References Cited

U.S. PATENT DOCUMENTS

| | | | | |
|---|---|---|---|---|
| 5,923,063 A | | 7/1999 | Liu et al. ..................... 257/316 |
| 5,945,705 A | * | 8/1999 | Liu et al. ..................... 257/315 |
| 6,133,132 A | * | 10/2000 | Toprac et al. ............... 438/595 |
| 6,211,020 B1 | | 4/2001 | Tripsas et al. .............. 438/294 |
| 6,306,737 B1 | * | 10/2001 | Mechrad et al. ............ 438/524 |
| 6,403,452 B1 | * | 6/2002 | Murakoshi et al. ......... 438/510 |
| 6,461,905 B1 | | 10/2002 | Wang et al. ................. 438/183 |
| 6,466,482 B2 | | 10/2002 | Shukuri et al. ......... 365/185.24 |
| 6,541,338 B2 | * | 4/2003 | Wang et al. ................. 438/258 |
| 6,579,778 B1 | * | 6/2003 | Tripsas et al. .............. 438/447 |
| 6,596,586 B1 | * | 7/2003 | Yang et al. .................. 438/257 |
| 6,665,623 B1 | * | 12/2003 | Pasadyn et al. ............... 702/84 |
| 6,682,947 B1 | * | 1/2004 | Madge ........................ 438/14 |

* cited by examiner

*Primary Examiner*—Maria Guerrero
(74) *Attorney, Agent, or Firm*—Williams, Morgan & Amerson, P.C.

(57) ABSTRACT

The present invention is generally directed to various methods of controlling $V_{ss}$ implants on memory devices, and a system for performing same. In one illustrative embodiment, the method comprises forming a plurality of trenches in a semiconducting substrate, measuring at least one physical characteristic of at least one of the trenches and determining at least one parameter of a $V_{SS}$ implant process to be performed on the substrate based upon the measured at least one physical characteristic of at least one trench.

19 Claims, 4 Drawing Sheets

METHODS OF CONTROLLING $V_{SS}$ IMPLANTS ON MEMORY DEVICES, AND SYSTEM FOR PERFORMING SAME

BACKGROUND OF THE INVENTION

1. Field of the Invention

This invention relates generally to semiconductor fabrication technology, and, more particularly, to various methods of controlling $V_{ss}$ implants on memory devices, and a system for performing same.

2. Description of the Relatrd Art

Flash memory devices are a type of EEPROM (Electrically Erasable Programmable Read-Only Memory). The term "flash" refers to the ability of the memory to be erased in blocks. As in other non-volatile memory devices, flash memory devices typically store electrical charges, representing data, in transistors having either a floating gate or a charge trapping dielectric. The stored charges affect the threshold voltage of the transistors. For example, in an n-channel floating gate transistor, an accumulation of electrons in the floating gate electrode creates a high threshold voltage in the transistor. The presence or absence of the stored charge can be determined by whether current flows between a source region and a drain region of the transistor when appropriate voltages are applied to the control gate, source and drain.

While there are myriad ways of configuring flash memory devices, in one common configuration sometimes called a NOR architecture, the drain regions of each memory cell (transistor) have a contact and are connected in rows forming bit lines in a conductive layer that runs above the memory cell stacks. The conductive layer can be, for example, a first metal layer. Source regions are typically connected by $V_{ss}$ lines running parallel to the word lines and leading to a common ground. The $V_{ss}$ lines are formed by doping the semiconductor substrate.

This configuration has proven useful in building compact, high-speed flash memory devices, however, there has been a continuous demand to further reduce the size of these devices. In further reducing the size of flash memory devices, the resistance in $V_{ss}$ lines has become an issue. As attempts are made to make smaller devices, it is found that the amount and depth of doping required to adequately lower resistance along $V_{ss}$ lines cannot be introduced without causing short channel effects. Thus, there has been an unsatisfied need for methods of further reducing the $V_{ss}$ resistance in flash memory devices without causing short channel effects.

The process of forming such $V_{ss}$ lines involves performing an implant process over an area that contains a number of exposed or empty trenches. For the $V_{ss}$ line to serve its intended function, it is important that this implant process be performed correctly such that the desired doped regions are formed in the substrate. However, using existing technology, variations in the resulting implant regions may occur due to a variety of factors. As a result of the variations, the electrical characteristics of the doped regions may not meet target performance characteristics. For example, the implant regions for the $V_{ss}$ lines may exhibit an increase in resistance in cases where, due to various factors, the doped region is not properly formed. As a result, the performance characteristics of the resulting memory device may not meet required performance specifications.

The present invention is directed to various methods and systems that may solve, or at least reduce, some or all of the aforementioned problems.

SUMMARY OF THE INVENTION

The present invention is generally directed to various methods of controlling $V_{ss}$ implants on memory devices, and a system for performing same. In one illustrative embodiment, the method comprises forming a plurality of trenches in a semiconducting substrate, measuring at least one physical characteristic of at least one of the trenches and determining at least one parameter of a $V_{ss}$ implant process to be performed on the substrate based upon the measured at least one physical characteristic of at least one trench. In further embodiments, the method comprises performing the $V_{ss}$ implant process comprised of the determined at least one parameter on the substrate. In some cases, the measured physical characteristic of the trench is comprised of at least one of a depth, an opening width, a sidewall angle and a profile of the trenches. In other cases, the present invention may be used to control or determine the dopant dose, implant energy and/or implant angle of the $V_{ss}$ implant process.

BRIEF DESCRIPTION OF THE DRAWINGS

The invention may be understood by reference to the following description taken in conjunction with the accompanying drawings, in which like reference numerals identify like elements, and in which.

Figure 1A:
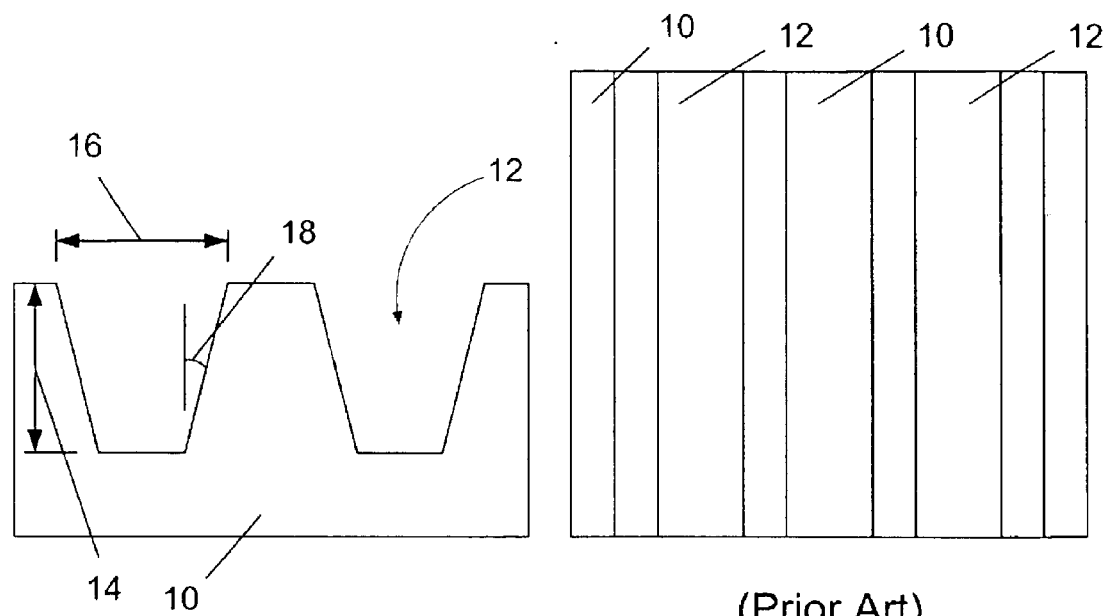
FIGS. 1A–1F are various cross-sectional and plan views of a portion of a semiconducting substrate wherein $V_{ss}$ implant regions are formed in accordance with one illustrative prior art process flow.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Although the various structures of the semiconductor device and the implant regions are depicted in the drawings as having very precise, sharp configurations and profiles, those skilled in the art recognize that, in reality, these regions and structures may not be as precise as indicated in the drawings. Additionally, the relative sizes of the various features and implant regions depicted in the drawings may be exaggerated or reduced as compared to the size of those features or regions on fabricated devices. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

In general, the present invention is directed to various methods of controlling $V_{ss}$ implants on memory devices, and a system for performing same. As will be readily apparent to those skilled in the art upon a complete reading of the present application, the present invention may be employed in connection with the formation of $V_{ss}$ implant regions in a semiconducting substrate, and it may be employed with a variety of different types of memory devices. Thus, the present invention should not be considered as limited to the particular embodiments disclosed herein unless such limitations are clearly set forth in the appended claims. U.S. Pat. No. 6,461,905 B1 entitled "Dummy Gate Process to Reduce the $V_{ss}$ Resistance of Flash Points," which is currently assigned to Advanced Micro Devices, Inc., the assignee of the present application, is hereby incorporated by reference in its entirety.

FIGS. 1A–1F depict one illustrative prior art process flow that is used in forming $V_{ss}$ lines for a memory device. Each drawing contains a cross-sectional and plan view of a portion of a semiconducting substrate 10. As shown in FIG. 1A, a plurality of trenches 12 are formed in the semiconducting substrate 10 using any of a variety of known photomasking and etching techniques. Typically, an anisotropic etching process is used to etch the trenches 12 in the substrate 10. Only two of the trenches 12 are depicted for purposes of clarity. In an actual memory device, thousands or millions of such trenches may be formed in the substrate 10 for each memory device. The target physical characteristics of the trench 12, e.g., depth 14, opening width 16 (ie., critical dimension (CD)), sidewall angle 18, trench profile, etc., may vary depending on the particular device under construction. By way of example only, the depth 14 of the trenches 12 may range from approximately 540–600 nm, the width 16 may range from approximately 320–390 nm, and the sidewall angle 18 may range from approximately 84–86 degrees.

Figure 1B:
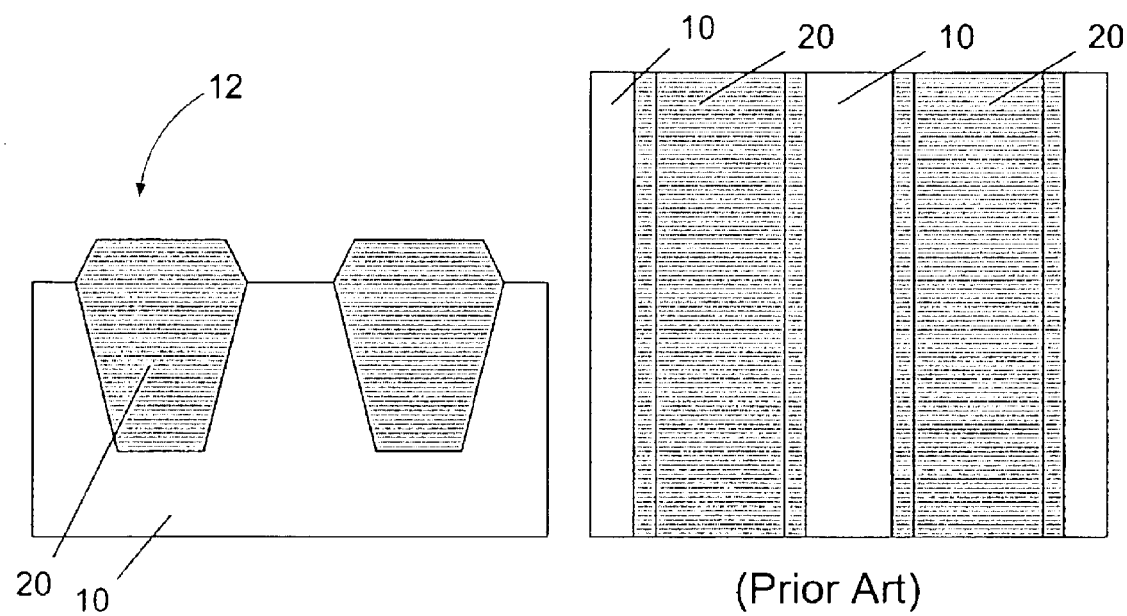
Figure 1C:
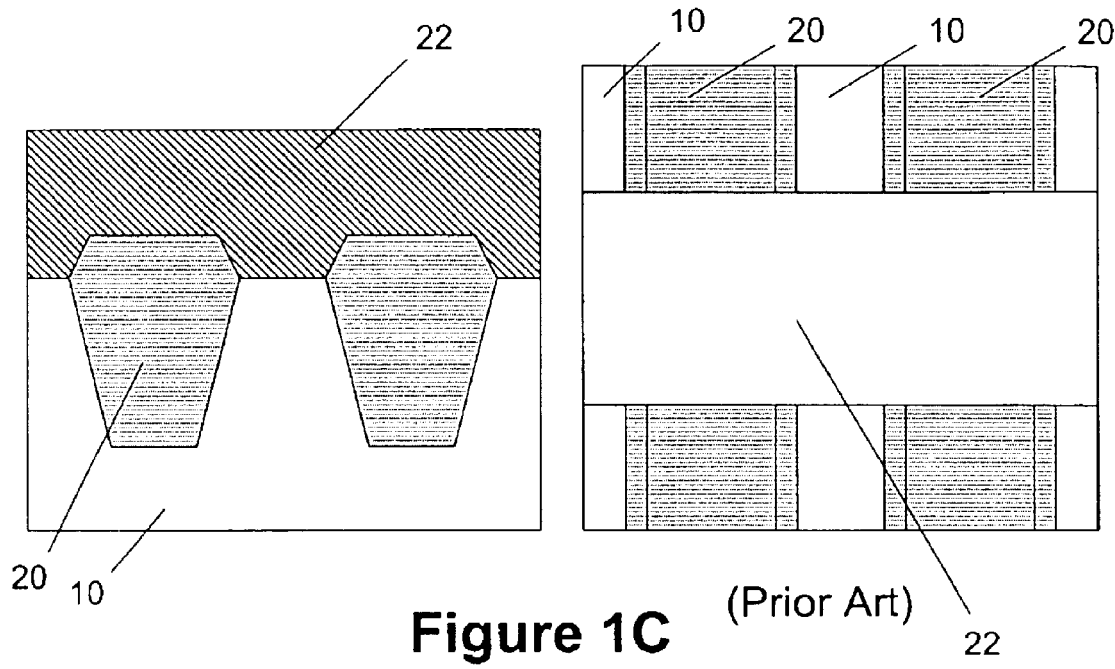

Next, as shown in FIG. 1B, an insulating material 20 is formed in the trenches 12. The insulating material 20 may be comprised of a variety of insulating materials, such as silicon dioxide. The insulating material 20 may be formed by a deposition process, such as a chemical vapor deposition process or by a high density plasma (HDP) process. In the case of a deposition process, an etchlpolish stop layer (not shown) may be formed above the substrate 10 and patterned prior to the formation of the trenches 12. After the trenches 12 are filled with the insulating material 20, a polishing process may be performed to remove excess amounts of the insulating material above the etch/polish stop layer. Thereafter, the etch/polish stop layer may be removed by a selective etching process to result in the structure depicted in FIG, 1B. Next, as shown in FIG. 1C, a masking layer 22 is formed above the substrate 10 in a direction that is approximately perpendicular to the trenches 12. The masking layer 22 may be comprised of a photoresist material, and it may be formed using a variety of known photolithography tools and techniques.

Figure 1D:
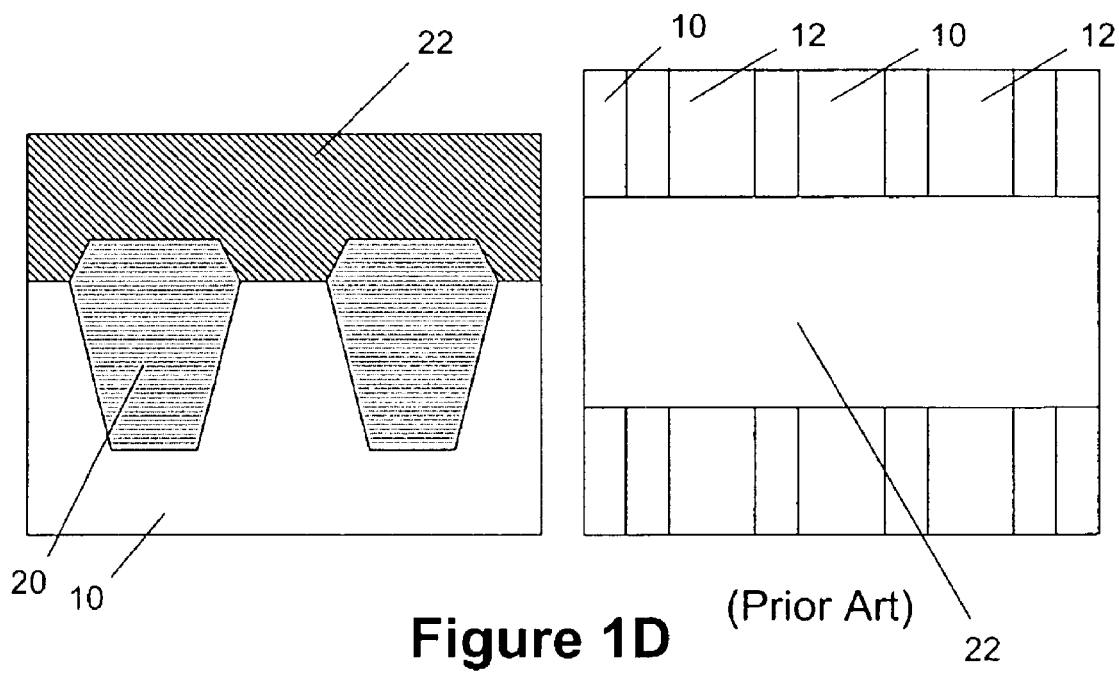

Then, as shown in FIG. 1D, the exposed insulating material 20 in the trenches 12 is removed by an etching process, such as, for example, a dry, anisotropic etching process. The process results in the exposure of the trenches 12 in the areas not covered by the masking layer 22.

Figure 1E:
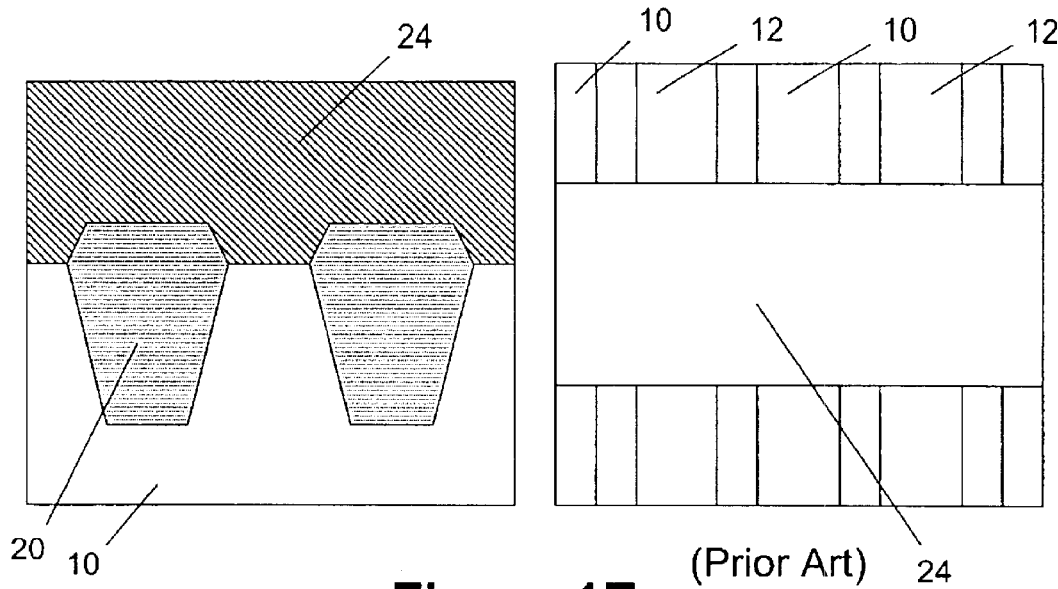

Thereafter, as indicated in FIG. 1E, the masking layer 22 is removed and a new masking layer 24 is formed to prepare for the implantation step used to form the $V_{ss}$ lines. The masking layer 24 may also be comprised of a photoresist material, and it may be formed by a variety of known techniques. This second masking layer 24 may not be required if the original masking layer 22 remaining after the etching process described above is sufficient for use during the subsequent $V_{ss}$ implant step.

Figure 1F:
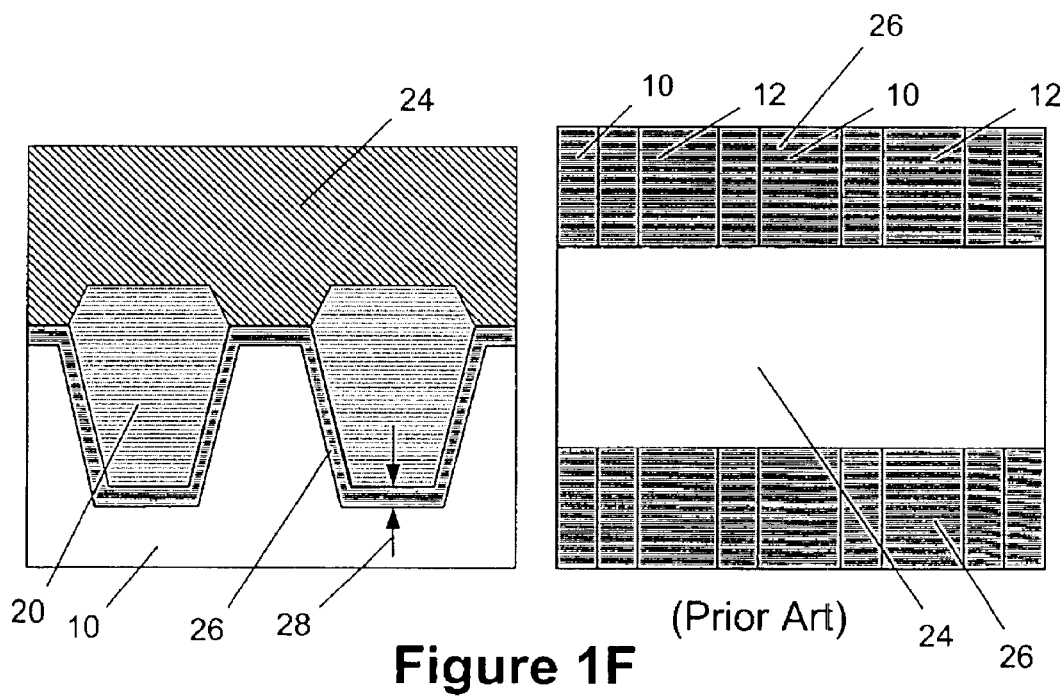

After the substrate 10 is prepared, one or more ion implant steps are performed to form $V_{ss}$ implant regions 26 in the substrate 10 in the areas not covered by the masking layer 24, as indicated in FIG. 1F. The parameters of the implant process used to form the implant regions 26 may vary depending upon the particular application. In one illustrative embodiment where arsenic is implanted into the substrate 10, the implant may be performed at a dopant dose of approximately $1.1–1.9 \times 10^{15}$ ions/cm$^2$ and at an energy level that is approximately 50 keV. The implant may be performed at an angle that ranges from approximately ±20–25 degrees. The depth 28 of the implant regions may vary.

Unfortunately, during manufacturing, the trenches 12 are not always formed to their targeted physical dimensions, e.g., depth 14, width 16, sidewall angle 18, etc., for a variety of reasons. Moreover, such variations may occur due to a variety of factors, i.e., equipment degradation, environmental conditions, variations in process gases used to perform the etching process to form the trenches 12, human error, etc. Even small variations in the manufactured physical dimensions of the trenches 12 may have adverse consequences as it relates to the formation of the $V_{ss}$ implant regions 26. For example, if the depth 14 of the trench 12 is greater than the target value, then the implant process used to form the implant regions 26, which is based upon the original target depth of the trench 12, may not be appropriate for forming the $V_{ss}$ implant regions 26 with the desired characteristics and/or at the appropriate location. In a similar sense, if the sidewall angle 18 of the trench 12 is less than its target value, i.e., if the trench 12 is more vertical than anticipated by the design process, then the original implant process may not be appropriate for forming the implant regions 26 in the trench 12 that is more vertical than that anticipated by the design process.

Figure 2:
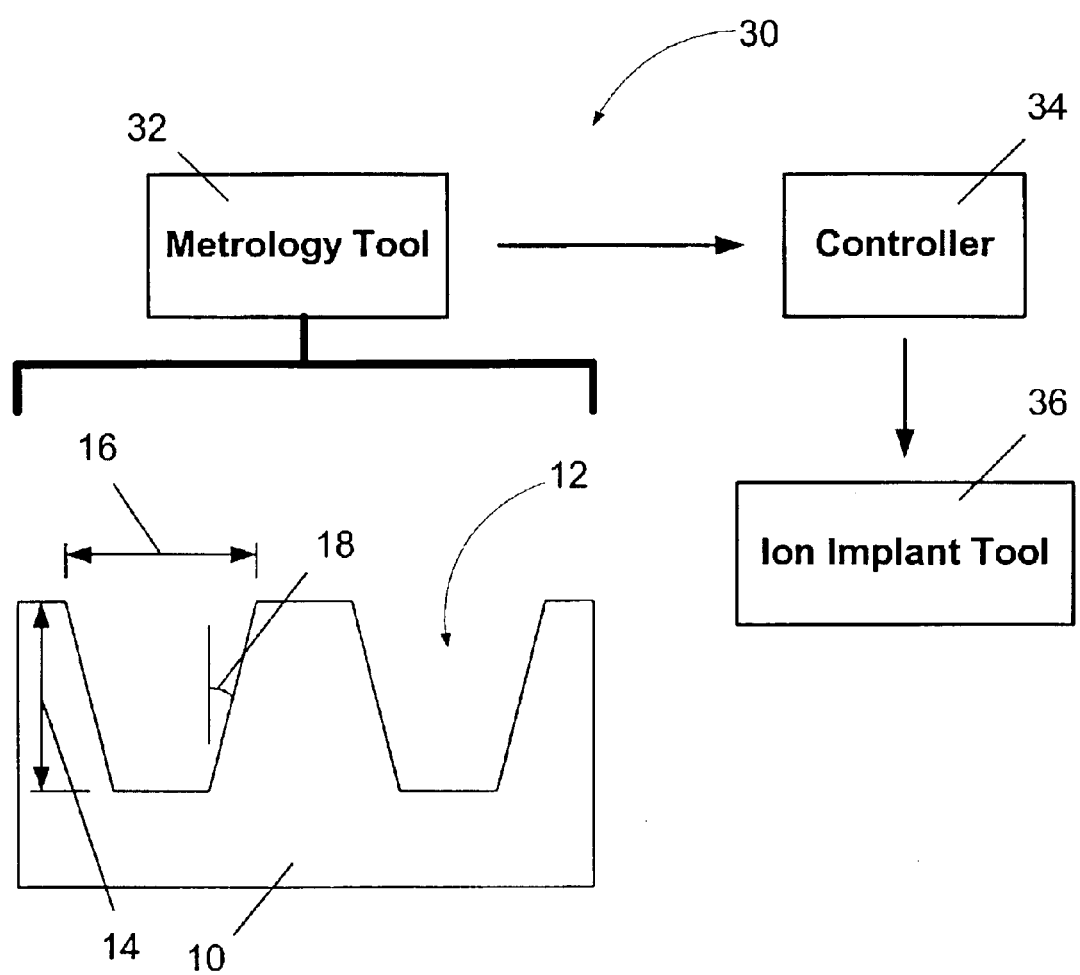
FIG. 2 depicts a system in accordance with one illustrative embodiment of the present invention.

FIG. 2 depicts an illustrative system 30 in accordance with one illustrative embodiment of the present invention. The system 30 is comprised of an illustrative metrology tool 32, a controller 34 and an ion implant tool 36. In general, the metrology tool 32 is adapted to measure one or more physical characteristics of the trenches 12 after they are formed. The metrology data is then provided to the controller 34 which, in turn, may adjust one or more parameters of the ion implant process performed in the ion implant tool 36. Simply put, the metrology data regarding at least one physical characteristic of the trench 12 is fed forward to the ion implant tool 36 such that compensatory adjustments may be made in the ion implantation process. Such compensatory adjustments are made to account for variations in the physical characteristics of the trenches 12, as actually manufactured, as compared to target values for those physical characteristics of the trenches 12. Of course, every variation may not require a corresponding change in a parameter of the implant process. Various rules may need to be established based upon the particular physical characteristic that varied, e.g., depth, and/or the magnitude of the variation.

The metrology tool 32 may be any type of metrology tool that is capable of providing metrology data with respect to one or more physical characteristics of the trenches 12, e.g., depth 14, opening width 16, sidewall angle 18, overall profile, etc. For example, the metrology tool 32 may be a scanning electron microscope, an ellipsometer, a profilometer, a scatterometry-based tool, an atomic force microscope (AFM), etc. Moreover, in making measurements of the trenches 12, more than one such metrology tool 32 may be employed. In making such measurements, any number of trenches 12 may be actually measured. If multiple trenches 12 are measured, the metrology data may be averaged or otherwise statistically manipulated to arrive at a value for the particular physical characteristic for the trenches 12. Additionally, the measurement of the physical characteristics of the trenches 12 may be performed after the trenches 12 are initially formed (as shown in FIG. 1A) and/or after the insulating material 20 has been removed from portions of the trenches 12 (as shown in FIG. 1E).

The ion implant tool 36 may be any type of tool capable of performing the ion implant process used to form the $V_{ss}$ implant regions 26. For example, a Varian® ion implant tool 36 may be employed with the present invention. Moreover, the present invention may be employed in connection with the implantation of any type of dopant material. When required, any parameter of the $V_{ss}$ implant process may be adjusted, e.g., implant dose, implant energy, implant angle, implant twist angle, etc.

In the illustrated embodiment, the controller 34 is a computer programmed with soft-ware to implement the functions described herein. Moreover, the functions described for the controller 34 may be performed by one or more controllers spread throughout a semiconductor manufacturing facility. For example, the controller 34 may be a fab level controller that is used to control processing operations throughout all or a portion of a semiconductor manufacturing facility. Alternatively, the controller 34 may be a lower level computer that controls only portions or cells of the manufacturing facility. Moreover, the controller 34 may be a stand-alone device, or it may reside on the metrology tool 32 or the ion implant tool 36. However, as will be appreciated by those of ordinary skill in the art, a hardware controller (not shown) designed to implement the particular functions may also be used.

Portions of the invention and corresponding detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "displaying" or the like, refer to the actions and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

An exemplary software system capable of being adapted to perform the functions of the controller 34, as described, is the Catalyst system offered by KLA Tencor, Inc. The Catalyst system uses Semiconductor Equipment and Materials International (SEMI) Computer Integrated Manufacturing (CIM) Framework compliant system technologies, and is based on the Advanced Process Control (APC) Framework. CIM (SEMI E81-0699—Provisional Specification for CIM Framework Domain Architecture) and APC (SEMI E930999—Provisional Specification for CIM Framework Advanced Process Control Component) specifications are publicly available from SEMI.

The present invention is generally directed to various methods of controlling $V_{ss}$ implants on memory devices, and a system for performing same. In one illustrative embodiment, the method comprises forming a plurality of trenches in a semiconducting substrate, measuring at least one physical characteristic of at least one of the trenches and determining at least one parameter of a $V_{ss}$ implant process to be performed on the substrate based upon the measured at least one physical characteristic of at least one trench. In further embodiments, the method comprises performing the $V_{ss}$ implant process comprised of the determined at least one parameter on the substrate. According to certain embodiments of the present invention, the measured physical characteristics of the trenches may include the depth, the opening width, the sidewall angle and/or the profile. In some cases, the present invention may be used to control or determine the dopant dose, implant energy and/or implant angle of the $V_{ss}$ implant process.

Through use of the present invention, better control may be achieved with respect to the formation of $V_{ss}$ implant regions. Moreover, variations in device performance capabilities may be reduced through use of the present invention.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of controlling a $V_{ss}$ implant process, comprising:

forming a plurality of trenches in at least one semiconducting substrate;

measuring at least one physical characteristic of at least one of said trenches; and determining at least one parameter of a $V_{SS}$ implant process to be performed if said measured at least one physical characteristic of said at least one trench is not within acceptable limits.

2. The method of claim 1, further comprising performing said $V_{SS}$ implant process comprised of said determined at least one parameter.

3. The method of claim 1, wherein forming said plurality of trenches in said at least one semiconducting substrate comprises etching said plurality of trenches in said at least one semiconducting substrate.

4. The method of claim 1, wherein said substrate is comprised of silicon.

5. The method of claim 1, wherein measuring at least one physical characteristic of at least one of said trenches comprises measuring at least one of a depth, an opening width, a sidewall angle and a profile of at least one of said trenches.

6. The method of claim 1, wherein determining at least one parameter of said $V_{SS}$ implant process comprises determining at least one of a dopant dose, an implant energy and an implant angle of said $V_{ss}$ implant process.

7. The method of claim 1, wherein said act of measuring at least one physical characteristic of said at least one trench is performed after said trench is formed in said at least one substrate but prior to the formation of an insulating material in said trench.

8. The method of claim 1, wherein said act of measuring at least one physical characteristic of said at least one trench is performed after an insulating material has been removed from a portion of said trench.

9. The method of claim 1, wherein measuring at least one physical characteristic of at least one of said trenches comprises measuring a plurality of physical characteristics of at least one of said trenches.

10. The method of claim 1, wherein measuring at least one physical characteristic of at least one of said trenches comprises measuring at least one physical characteristic of a plurality of said trenches.

11. A method of controlling a $V_{SS}$ implant process, comprising:

etching a plurality of trenches in at least one semiconducting substrate;

measuring at least one physical characteristic of at least one of said trenches;

determining at least one parameter of a $V_{SS}$ implant process to be performed if said measured at least one physical characteristic of said at least one trench is not within acceptable limits, said at least one parameter being comprised of at least one of an implant dose, an implant energy and an implant angle; and performing said $V_{SS}$ implant process comprised of said determined at least one parameter.

12. The method of claim 11, wherein measuring at least one physical characteristic of at least one of said trenches comprises measuring at least one of a depth, an opening width, a sidewall angle and a profile of at least one of said trenches.

13. The method of claim 11, wherein said act of measuring at least one physical characteristic of said at least one trench is performed after said trench is formed in said substrate but prior to the formation of an insulating material in said trench.

14. The method of claim 11, wherein said act of measuring at least one physical characteristic of said at least one trench is performed after an insulating material has been removed from a portion of said trench.

15. The method of claim 11, wherein measuring at least one physical characteristic of at least one of said trenches comprises measuring a plurality of physical characteristics of at least one of said trenches.

16. The method of claim 11, wherein measuring at least one physical characteristic of at least one of said trenches comprises measuring at least one physical characteristic of a plurality of said trenches.

17. A method of controlling a $V_{SS}$ implant process, comprising:

etching a plurality of trenches in at least one semiconducting;

measuring at least one physical characteristic of at least one of said trenches, said physical characteristic being comprised of at least one of a depth, an opening width, a sidewall angle and a profile of at least one of said trenches;

determining at least one parameter of a $V_{SS}$ implant process to be performed if said measured at least one physical characteristic of said at least one trench is not within acceptable limits, said at least one parameter being comprised of at least one of an implant dose, an implant energy and an implant angle; and performing said $V_{SS}$ implant process comprised of said determined at least one parameter.

18. The method of claim 17, wherein said act of measuring at least one physical characteristic of said at least one trench is performed after said trench is formed in said substrate but prior to the formation of an insulating material in said trench.

19. The method of claim 17, wherein said act of measuring at least one physical characteristic of said at least one trench is performed after an insulating material has been removed from a portion of said trench.

* * * * *